(12) United States Patent
Zhang (10) Patent No.: US 11,694,700 B2
(45) Date of Patent: Jul. 4, 2023

(54) METHOD, APPARATUS AND DEVICE FOR PROCESSING SOUND SIGNAL

(71) Applicant: GOERTEK INC., Shandong (CN)

(72) Inventor: Xiaohong Zhang, Shandong (CN)

(73) Assignee: Goertek Inc., Weifang (CN)

( * ) Notice: Subject to any disclaimer, the term of this patent is extended or adjusted under 35 U.S.C. 154(b) by 117 days.

(21) Appl. No.: 17/433,127

(22) PCT Filed: Sep. 29, 2019

(86) PCT No.: PCT/CN2019/108941
§ 371 (c)(1),
(2) Date: Aug. 23, 2021

(87) PCT Pub. No.: WO2020/237954
PCT Pub. Date: Dec. 3, 2020

(65) Prior Publication Data
US 2022/0148605 A1    May 12, 2022

(30) Foreign Application Priority Data
May 31, 2019  (CN) .......................... 201910471973.6

(51) Int. Cl.
*G10L 19/02*    (2013.01)
*G10L 19/005*   (2013.01)
*G10L 25/18*    (2013.01)

(52) U.S. Cl.
CPC ............ *G10L 19/02* (2013.01); *G10L 19/005* (2013.01); *G10L 25/18* (2013.01)

(58) Field of Classification Search
CPC ....... G10L 19/02; G10L 19/005; G10L 25/18; G10L 25/51; G10L 21/0316;
(Continued)

(56) References Cited

U.S. PATENT DOCUMENTS 5,418,859 A * 5/1995 Cho .................. H03G 5/165
                                                381/103
7,088,276 B1 * 8/2006 Wegener ............ G06F 17/141
                                                341/51

(Continued)

FOREIGN PATENT DOCUMENTS

| CN | 1398054 A   | 2/2003  |
| CN | 102740214 A | 10/2012 |
| CN | 110265042 A | 9/2019  |

*Primary Examiner* — Akwasi M Sarpong
(74) *Attorney, Agent, or Firm* — Baker Botts LLP (57) ABSTRACT

The present disclosure provides a method, an apparatus and a device for processing a sound signal, wherein the method comprises: acquiring a transmitted signal spectrum of a target sound signal sent out by a loudspeaker and a received signal spectrum of the target sound signal received by a microphone; detecting whether there is a signal distortion frequency band with signal distortion in the target sound signal according to the transmitted signal spectrum and the received signal spectrum, and when detecting that the signal distortion frequency band exists, performing compression processing on the target sound signal according to the signal distortion frequency band during a current signal processing cycle, and transmitting a compressed target sound signal through the loudspeaker.

6 Claims, 7 Drawing Sheets

(58) Field of Classification Search
CPC ...... G10L 19/0017; H03G 9/025; H04R 3/04; H04R 29/001
USPC .......................................................... 704/5
See application file for complete search history.

(56) References Cited

U.S. PATENT DOCUMENTS

| | | | | |
|---|---|---|---|---|
| 7,394,410 B1* | 7/2008 | Wegener | ................ | H03M 7/30 341/61 |
| 8,634,578 B2* | 1/2014 | Vickers | ................... | H04R 3/04 381/322 |
| 9,431,986 B2* | 8/2016 | Aoki | ....................... | H03G 3/00 |
| 9,935,599 B2* | 4/2018 | Seefeldt | ................. | H03G 9/025 |
| 2007/0136050 A1* | 6/2007 | Tourwe | ................. | H03G 5/005 704/E21.009 |
| 2010/0254546 A1* | 10/2010 | Hosomi | ................ | H03G 9/025 381/104 |
| 2011/0200208 A1* | 8/2011 | Shim | ..................... | H04B 13/00 381/94.1 |
| 2011/0320210 A1* | 12/2011 | Vickers | ................. | H03G 9/025 704/500 |
| 2012/0209616 A1* | 8/2012 | Hosokawa | ............ | H03G 9/025 704/500 |
| 2013/0271307 A1* | 10/2013 | Kropfitsch | ............ | H03G 3/002 341/158 |
| 2014/0379355 A1* | 12/2014 | Hosokawsa | ........... | H03G 9/025 704/500 |
| 2016/0241215 A1* | 8/2016 | Seefeldt | ................... | H04R 3/04 |
| 2016/0255452 A1* | 9/2016 | Nowak | ................. | G10L 19/008 381/17 |
| 2016/0364382 A1* | 12/2016 | Sarikaya | ............... | G06F 40/40 |
| 2016/0381468 A1* | 12/2016 | Petrausch | ............... | H03G 7/00 381/320 |
| 2019/0027159 A1* | 1/2019 | Sugiyama | ........... | G10L 21/0208 |
| 2022/0149904 A1* | 5/2022 | Timo | ................... | H03M 7/3059 |

* cited by examiner

Sound signal processing apparatus 5000
- Spectrum acquisition unit 5010
- Distortion detection unit 5020
- Compression processing unit 5030

Fig.5

Sound signal processing apparatus 6000
- Memory 6010
- Processor 6020

METHOD, APPARATUS AND DEVICE FOR PROCESSING SOUND SIGNAL

CROSS-REFERENCE TO RELATED APPLICATION

This application is a National Stage of International Application No. PCT/CN2019/108941 filed on Sep. 29, 2019, which claims priority to Chinese Patent Application No. 201910471973.6 entitled "METHOD, APPARATUS AND DEVICE FOR PROCESSING SOUND SIGNAL" filed with the CNIPA on May 31, 2019, which is hereby incorporated by reference in its entirety.

TECHNICAL FIELD

The present disclosure relates to the technical field of signal processing, more specifically to a method, an apparatus and a device for processing sound signal.

BACKGROUND OF THE INVENTION

Acoustic products with sound playing function (for example speakers, headphones, virtual reality devices, etc.) usually produce large nonlinear distortion when playing sound with high power through speakers. Such nonlinear distortion is usually the second or third harmonic distortion, which will greatly impair sound quality of the speaker and even cause damage to the speaker.

SUMMARY OF THE INVENTION

The present disclosure is intended to provide a new technical solution for sound signal processing.

According to a first aspect of the present disclosure, a method for processing a sound signal is provided, which comprises:

acquiring, from a previous signal processing cycle, a transmitted signal spectrum of a target sound signal sent out by the loudspeaker and a received signal spectrum of the target sound signal received by the microphone;

detecting whether there is a signal distortion frequency band with signal distortion in the target sound signal according to the transmitted signal spectrum and the received signal spectrum, when detecting that the signal distortion frequency band exists, performing compression processing on the target sound signal according to the signal distortion frequency band during a current signal processing cycle, and transmitting a compressed target sound signal through the loudspeaker.

According to a second aspect of the present disclosure, an apparatus for processing sound signal is provided, wherein, comprises:

a spectrum acquisition unit configured to acquire a transmitted signal spectrum of a target sound signal sent out by the loudspeaker and a received signal spectrum of the target sound signal received by the microphone from a previous signal processing cycle;

a distortion detection unit configured to detect whether there is a signal distortion frequency band with signal distortion in the target sound signal, according to the transmitted signal spectrum and the received signal spectrum;

a compression processing unit configured to perform compression processing on the target sound signal according to the signal distortion frequency band during the current signal processing cycle when detecting that the signal distortion frequency band exists, and transmitting a compressed target sound signal through the loudspeaker.

According to a third aspect of the present disclosure, an apparatus for processing sound signal is provided, wherein, comprises:

a memory configured to store executable instructions;

a processor configured to operate the sound signal processing apparatus under control of the executable instructions to perform the sound signal processing method as provided in any of a first aspect.

According to a forth aspect of the present disclosure, a sound signal processing device is provided, wherein, comprises:

a loudspeaker;
a microphone;
the sound signal processing apparatus as described in the second aspect or the third aspect.

According to an embodiment of the present disclosure, for a device incorporating speakers and microphones, it is possible to detect whether there is a signal distortion frequency band with signal distortion in target sound signals according to the sent signal spectrum of the target sound signals sent out by the speakers and the received signal spectrum of the target sound signals received by the microphones of the same device, and carry out corresponding signal compression processing for target sound signals within the signal distortion frequency band, so as to adaptively and dynamically eliminate signal distortion, improve the sound quality of sound signals sent out by speakers, and reduce the damage risk of speakers.

Other features and advantages of the present disclosure will become clear from the following detailed description of exemplary embodiments of the present disclosure with reference to the accompanying drawings.

BRIEF DESCRIPTION OF THE DRAWINGS

The accompanying drawings, which are incorporated in and constitute a part of the specification, illustrate embodiments of the present disclosure and, together with the description, serve to explain the principles of the application.

DETAILED DESCRIPTION

In order to further clarity the objectives, technical solutions, and advantages of the embodiment of the present disclosure, the following clearly and completely describes the technical solutions in the embodiments of the present disclosure with reference to the accompanying drawings in the embodiments of the present disclosure, apparently, the described embodiments are some but not all of the embodiments of the present disclosure. All other embodiments obtained by a person of ordinary skill in the art based on the embodiments of the present disclosure without creative efforts shall fall within the protection scope of the present disclosure.

The following description of at least one exemplary embodiment is merely illustrative in nature and in no way serves as any limitation on the present disclosure and its application or use.

Techniques, methods and device known to those of ordinary skill in related arts may not be discussed in detail, but where appropriate, the techniques, methods and device should be regarded as part of the specification.

In all examples shown and discussed herein, any specific values should be interpreted as exemplary only and not as limiting. Therefore, other examples of the exemplary embodiment may have different values.

It should be noted that similar reference numerals and letters indicate similar items in the following figures, and therefore, once an item is defined in one figure, it does not need to be further discussed in the following figures.

Hardware Configuration

Figure 1:
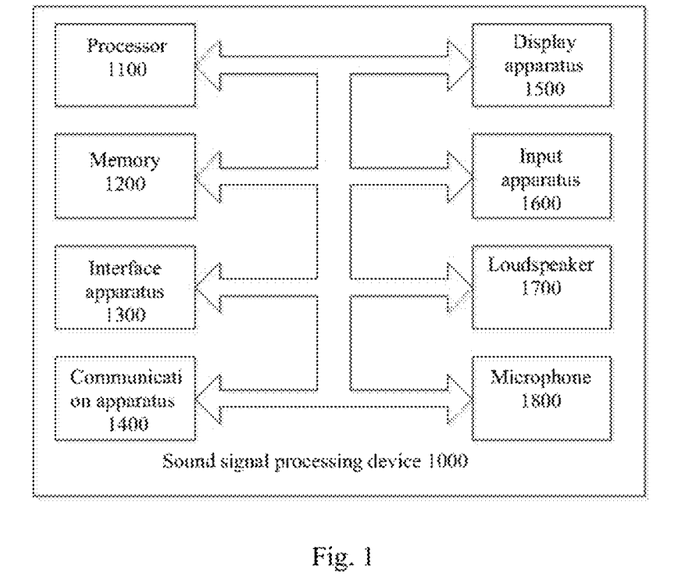
FIG. 1 is a block diagram showing an example of a hardware configuration of a sound signal processing device that can be used to implement an embodiment of the present disclosure.

FIG. 1 illustrates a block diagram of a sound signal processing device 1000 that may be configured to implement the sound signal processing method provided by an embodiment of the present disclosure.

The sound signal processing device 1000 may be other intelligent devices such as headphones, virtual reality devices, sound boxes, TV boxes, or any electronic devices with microphones and speakers, for example mobile phones and tablet computers.

In one example, as shown in FIG. 1, the sound signal processing device 1000 may comprise a processor 1100, a memory 1200, an interface apparatus 1300, a communication apparatus 1400, a display apparatus 1500, an input apparatus 1600, a speaker 1700, a microphone 1800, and the like. Wherein, the processor 1100 may be a central processing unit CPU, a microprocessor MCU, and the like. The memory 1200 comprises, for example, ROM (read only memory), RAM (random access memory), nonvolatile memory such as a hard disk, and the like. The interface apparatus 1300 comprises, for example, a USB interface, an earphone interface, and the like. The communication apparatus 1400 can perform wired or wireless communication, for example, and can specifically comprise Wifi communication, Bluetooth communication, 2G/3G/4G/5G communication, and the like. The display apparatus 1500 is, for example, a liquid crystal display screen, a touch display screen, and the like. The input apparatus 1600 may comprises, for example, a touch screen, a keyboard, and somatosensory input. The user can input/output voice information through the speaker 1700 and the microphone 1800.

The sound signal processing device shown in FIG. 1 is merely illustrative and in no way means any limitation to the present disclosure, its application or use. Applied to the embodiment of the present disclosure, the memory 1200 of the sound signal processing device 1000 is used to store instructions, which are used to control the processor 1100 for operation to execute any one of the sound signal processing methods provided by the embodiment of the present disclosure. Those skilled in the art understand that although a plurality of apparatuses are illustrated for the sound signal processing device 1000 in FIG. 1, the present disclosure may only involve some of the apparatuses, for example, the sound signal processing device 1000 only involves the processor 1100 and the storage apparatus 1200. A skilled person can design instructions according to the scheme disclosed in the present disclosure. How the instruction controls the operation of the processor is well known in the art, and it will not be described in detail here.

Method

Figure 2:
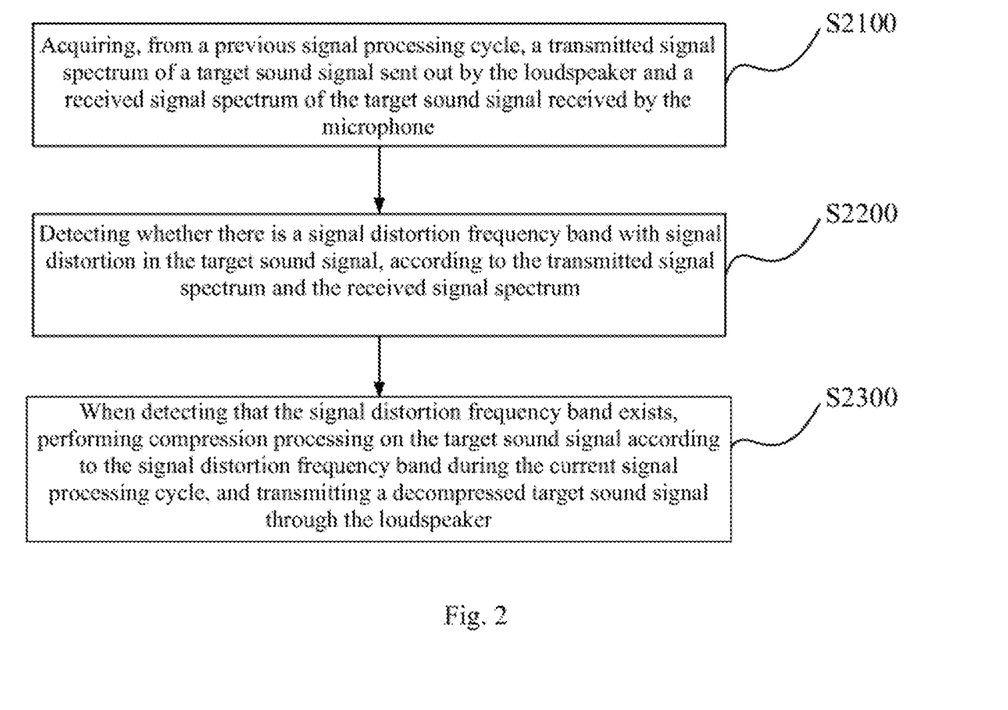
FIG. 2 is a schematic flowchart of a sound signal processing method according to an embodiment of the present disclosure.

FIG. 2 is a schematic flowchart of a sound signal processing method according to an embodiment.

Referring to FIG. 2, the sound signal processing method of this embodiment may be implemented in any device incorporating speakers and microphones, for example, mobile phones, tablet computers, smart headphones, smart speakers, virtual reality devices, and so on. The loudspeaker may be any apparatus with sound playing and amplifying functions, for example a loudspeaker.

The sound signal processing method of this embodiment may comprise the following steps S2100-S2300.

Step S2100, acquiring, from a previous signal processing cycle, a transmitted signal spectrum of a target sound signal sent out by the loudspeaker and a received signal spectrum of the target sound signal received by the microphone.

The sound signal processing method provided in this embodiment is implemented based on signal processing cycles. In each current signal processing cycle, the signal-related information of the previous signal processing cycle is acquired to implement processing of sound signals in this signal processing cycle. The signal processing cycle can be set according to specific application scenarios or application requirements, for example, 50 milliseconds.

In this embodiment, it is necessary to acquire the transmitted signal spectrum and the received signal spectrum of the previous signal processing cycle.

The transmitted signal spectrum may be the signal spectrum of the target sound signal sent out by the speaker, specifically the signal spectrum of the electric signal before entering the speaker, that is, the front end signal spectrum of the speaker.

The received signal spectrum may be a signal spectrum in which the target sound signal received by the microphone is converted into an electrical signal.

In this embodiment, the transmitted signal spectrum and the received signal spectrum can be obtained by monitoring the signal states (comprising signal frequency, signal energy, etc.) of the target sound signal sent out by the speaker and the target sound signal received by the microphone in the same device in the same signal cycle.

After acquiring the signal spectrum sent out by the speaker and the signal spectrum received by the microphone from a previous signal processing cycle, enter:

Step S2200, detecting whether there is a signal distortion frequency band with signal distortion in the target sound signal according to the transmitted signal spectrum and the received signal spectrum.

Loudspeakers usually produce large nonlinear distortion when they sent out sound signals with high power. In this embodiment, whether there is a signal distortion band in the target sound signal is detected through the sent signal spectrum of the target sound signal sent out by the speaker and the receiving signal spectrum of the target sound signal received by the microphone in the same device, and the corresponding signal compression processing may be performed on the sound signal in the signal distortion band in combination with the subsequent steps, so as to avoid further signal distortion, improving the sound quality of the sound signal sent out by the speaker and reducing the risk of damage to the speaker.

In a specific example, the step S2200 of detecting whether there is a signal distortion frequency band with signal distortion in the target sound signal according to the transmitted signal spectrum and the received signal spectrum, can comprise the following steps: S2210-S2230.

Step S2210, acquiring a signal transfer function of the sound signal transmitted to the microphone through the speaker.

In this example, the signal transfer function is the frequency response curve of the signal expressed in the form of a function. The frequency response curve is a curve drawn according to the signal transmission environment corresponding to the signal transmission function or the response given by the signal transmission system at different frequencies. Through the signal transfer function, frequency domain signal energy corresponding to each input frequency point in the corresponding signal transmission path or signal transmission environment may be acquired.

The signal transfer function of sound signal transmitted from a loudspeaker to a microphone is a transfer function corresponding to a transmission path that the loudspeaker converts electrical signal into sound signal and transmits it to the microphone, and then the microphone converts it into electrical signal.

In this example, in a stage of device developing, device manufacturing or device testing, sound signal data relating to a speaker working at different frequencies and a microphone receiving the corresponding sound signal can be detected through an instrument with signal detection function such as spectrometer. Through analysis on the sound signal data, the signal transfer function of the sound signal transmitted to the microphone through the speaker can be obtained and can be stored in a local storage of the device so that it can be read and called when step S2120 is implemented.

Step S2220, acquiring a signal difference spectrum according to the signal transfer function, the transmitted signal spectrum and the received signal spectrum.

The frequency spectrum of signal difference can characterize change between the frequency domain signal energy of the sound signal sent out by the speaker corresponding to different frequency points and the frequency domain signal energy received by the microphone through the propagation path of the sound signal during signal transmission from the speaker to the microphone.

In a more specific example, the signal difference spectrum D between the transmitted signal spectrum of the speaker and the received signal spectrum of the microphone can be acquired by the following formula (1):

$$D = P_2 - P_1 * H \quad (1)$$

Wherein, H is a signal transfer function that the loudspeaker electrical signal is converted into acoustic signal, which is transmitted to the microphone and then converted into electrical signal, $P_1$ is an acquired sent signal spectrum of the target sound signal sent out by the loudspeaker, and $P_2$ is an acquired receiving signal spectrum of the target sound signal received by the microphone.

Step S2230, determining a frequency band with a spectrum amplitude value larger than a preset distortion threshold as the signal distortion frequency band when detecting that the frequency band with the spectrum amplitude value larger than the preset distortion threshold exists in the signal difference spectrum.

In this example, the distortion threshold is a threshold for judging whether or not signal distortion occurs based on the spectral amplitude value of the signal difference spectrum. By setting the distortion threshold, the frequency band with signal distortion can be quickly detected based on the spectrum amplitude value in the signal difference spectrum. The distortion threshold can be set according to engineering experience or experimental simulation results, for example, the distortion threshold is set to 0.4 dB (decibel).

The spectrum amplitude value of the signal difference spectrum can be in dB form, or converted from non-dB form to dB form and then compared with the distortion threshold.

By setting the distortion threshold, it can be judged whether there is a frequency band with signal distortion in the detected signal difference spectrum, if there is a frequency band with signal distortion in the signal difference spectrum, the signal distortion frequency band is determined, and the compression processing of the signal distortion frequency band is carried out in combination with the subsequent steps, so as to avoid the effect of signal distortion on the sound quality of the output sound signal and reduce the possible damage risk of the loudspeaker.

After determining the signal distortion frequency band in the target sound signal, enter:

step S2300, when detecting that the signal distortion frequency band exists, performing compression processing on the target sound signal according to the signal distortion frequency band during a current signal processing cycle, and transmitting a compressed target sound signal through the loudspeaker.

When detecting that the signal distortion frequency band exists, performing compression processing on the target sound signal according to the signal distortion frequency band during the current signal processing cycle, can eliminate or reduce signal distortion of the target sound signal in the corresponding signal distortion frequency band in real time, correspondingly improve sound quality of the sound signal emitted by the loudspeaker, and simultaneously reduce damage risk of the loudspeaker.

In a more specific example, the step S2300 of performing compression processing on the target sound signal according to the signal distortion frequency band during a current signal processing cycle, and transmitting a compressed target sound signal through the loudspeaker when detecting that the signal distortion frequency band exists can comprise the following steps: S2310-S2320.

Step S2310, determining a compression processing frequency band for performing compression processing on the target sound signal according to a preset compression upper limit coefficient, a preset compression lower limit coefficient and the signal distortion frequency band.

Compression upper limit coefficient and compression lower limit coefficient are coefficients respectively set for the upper limit and lower limit frequency bands of compression processing frequency bands, and can be set according to specific application scenarios or application requirements. For example, the compression upper limit coefficient can be set to ½ and the compression lower limit coefficient can be set to ⅓.

Assuming the signal distortion frequency band of the previous signal processing cycle is [F1,F2], the compression upper limit coefficient is set as ½, and the compression lower limit coefficient is set as ⅓, the upper limit value of compression processing frequency band is determined as $F_2/2$ based on the compression upper limit coefficient and signal distortion frequency band, and the lower limit value of compression processing frequency band is determined as $F_1/3$ based on the compression lower limit coefficient and signal distortion frequency band, and therefore the compression processing frequency band of the target sound signal is determined as Range=[$F_1/3$, $F_2/2$].

Step S2320, during the current signal processing cycle, performing compression processing on the target sound signal in the compression processing frequency band according to a preset compression gain, and correspondingly updating a total compression gain of the target sound signal in the compression processing frequency band.

The preset compression gain is a signal gain according to which the target sound signal is compressed, and can be expressed in dB. The value of the specific compression gain can be selected according to the engineering experience value in the specific application scenario, for example, it is selected as 1 dB, and correspondingly, the frequency domain signal energy of the sound signal is reduced by 1 dB after each compression process.

An updating form of the total compression gain can be implemented according to a specific embodiment, for example, during the current signal processing cycle, for a certain compression processing frequency band, assuming the total compression gain is N before compression, then the total compression gain is updated to N−1 or N+1 after compression of the target sound signal in the compression processing frequency band.

After performing signal compression processing on the target sound signal, the total compression gain of the target sound signal in the compression processing frequency band can be updated correspondingly, and the signal compression accumulated in the corresponding compression processing frequency band can be recorded through the total compression gain, in the subsequent signal processing cycle, the compression processing process of the target sound signal can be dynamically adjusted according to the total compression gain of each compression processing frequency band in combination with the transmission state of the corresponding sound signal, thus achieving adaptive signal compression processing and removing signal distortion more accurately.

The sound signal processing method shown in FIG. 2 has been described above with examples. The sound signal processing method provided in this embodiment may further comprise the steps shown in FIG. 3: S3100-S3200.

Figure 3:
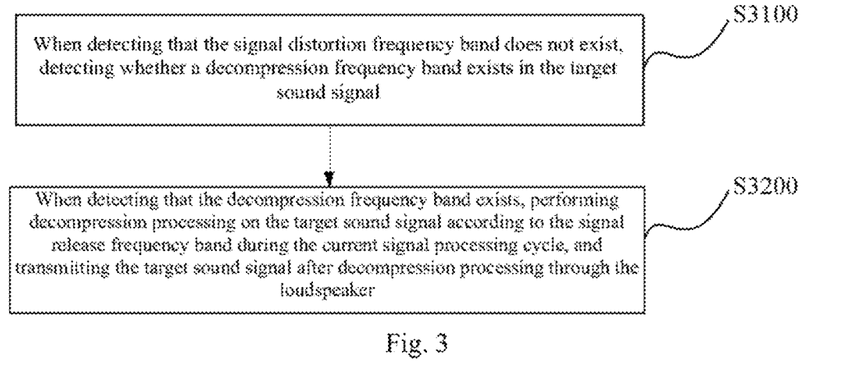
FIG. 3 is a schematic flowchart of a sound signal processing method according to another embodiment of the present disclosure.

Step S3100, when detecting that the signal distortion frequency band does not exist, detecting whether a decompression frequency band exists in the target sound signal.

Decompression frequency band refers to whether there is a frequency band in the target sound signal that needs to be released and recovered after signal compression.

Detecting that there is no signal distortion frequency band means that there is no signal distortion in the target sound signal that had been processed in the previous signal processing cycle, and thus there is no need to deal with the signal distortion. Accordingly, by detecting whether there is a decompression frequency band in the target sound signal, the corresponding decompression processing can be performed on the target sound signal in the decompression frequency band in combination with the subsequent steps, so that the compression processing of the target sound signal can be adjusted in real time, dynamically and adaptively according to the current signal transmission state, and the signal can be eliminated accurately.

In a more specific example, the step S3100 of detecting whether a decompression frequency band exists in the target sound signal when detecting that the signal distortion frequency band does not exist may comprise the following steps: S3110a-S3120a.

Step S3110a, acquiring a total compression gain of the target sound signal in each signal compression frequency band subjected to signal compression processing from the previous signal processing cycle.

Total compression gain is the accumulated compression gain recorded for the corresponding signal compression frequency band, which can reflect the compression processing state of the target sound signal in the corresponding signal compression frequency band in the previous signal processing process.

Step S3120a, when there is at least one signal compression frequency band with the total compression gain other than 0 and when it is detected that the spectrum amplitude values of the signal compression frequency band are all smaller than a preset decompression threshold in the signal difference spectrum acquired according to the signal transfer function, the transmitted signal spectrum and the received signal spectrum, determining the signal compression frequency band as the decompression frequency band.

Signal transfer function is a transfer function of sound signal transmitted to the microphone through the speaker, its specific meaning is as mentioned above, so it is not repeated here.

The decompression threshold is a threshold for judging whether to perform decompression on the target sound signal according to the spectral amplitude value in the frequency of signal difference. Decompression threshold can be set according to engineering experience or experimental simulation results.

In this example, the decompression threshold can be set to be smaller than the distortion threshold, which can prevent the signals close to the distortion threshold in the signal spectrum from entering the endless loop where compression processing and decompression processing are alternately performed. For example, the distortion threshold is set to 0.4 dB, and the decompression threshold can be set to 0.3 dB.

The related description of the signal difference spectrum has been described in the foregoing, and will not be repeated here.

In this embodiment, by setting the decompression threshold and comparing it with the signal difference spectrum in the latest signal processing cycle, it is possible to determine the decompression frequency band to be compressed according to the latest signal transmission state in all frequency bands corresponding to the target sound signal after compression processing, so that the target sound signal in the decompression frequency band can be compressed and released in combination with subsequent steps, so that the target sound signal can be transmitted based on larger signal energy, and the target can be effectively guaranteed on the premise of accurately eliminating signal distortion.

In a more specific another example, the step S3100 of detecting whether a decompression frequency band exists in the target sound signal, when detecting that the signal distortion frequency band does not exist may comprise the following steps: S3110b-S3120b.

Step S3110b, acquiring a total compression gain of the target sound signal in each signal compression frequency band subjected to signal compression processing from the previous signal processing cycle.

Step S3110b may be the same as step S3110a in another example described above, and will not be repeated here.

Step S3120b, for each signal compression frequency band whose total compression gain is not 0, determining the signal compression frequency band as the decompression frequency band when spectrum amplitude values of a compressed signal difference spectrum are detected to be smaller than a preset decompression threshold in the compressed signal difference spectrum acquired according to the signal transfer function, the transmitted signal spectrum and the received signal spectrum.

The signal transfer function and decompression threshold have been described in detail in the foregoing, so they are not repeated here.

When the signal difference spectrum is compressed, it is acquired according to the signal transfer function, the transmitted signal spectrum and the received signal spectrum of the latest signal processing cycle for the corresponding signal compression frequency band, which is similar to the way of obtaining the signal difference spectrum, and will not be repeated here.

In this embodiment, by setting the decompression threshold and comparing it with the compressed signal difference frequency spectrum of the signal compression frequency band in the latest signal processing cycle, it is possible to determine the decompression frequency band to be compressed according to the latest signal transmission state in the compressed signal frequency band after compression processing is performed on the target sound signal, so as to perform decompression processing on the target sound signal in the compressed release frequency band in combination with subsequent steps, therefore, the target sound signal can be transmitted based on larger signal energy, and the transmission performance of the target sound signal can be effectively guaranteed on the premise of accurately eliminating signal distortion. At the same time, the detection and processing of decompression are only implemented for specific frequency bands, which can further improve the efficiency of decompression processing.

After detecting the presence of decompression frequency band in the target sound signal, enter:

step S3200, when detecting that the decompression frequency band exists, performing decompression processing on the target sound signal according to a signal release frequency band in a current signal processing cycle, and transmitting a decompressed target sound signal through the loudspeaker.

In this embodiment, there is a decompression frequency band in the target sound signal, and the decompression processing of the decompression frequency band can prevent the signal after compression processing from becoming smaller and affecting the sound quality of the target sound signal.

In a more specific example, the step S3200 of performing decompression processing on the target sound signal according to a signal release frequency band in a current signal processing cycle, and transmitting a decompressed target sound signal through the loudspeaker, when detecting that the decompression frequency band exists, can comprise the following steps: S3210.

Step S3210, during the current signal processing cycle, performing decompression processing on the target sound signal in the decompression frequency band according to the preset compression gain, and correspondingly updating a total compression gain of the target sound signal in the decompression frequency band.

The preset compression gain is the signal gain according to which the target sound signal is compressed and released, and can be expressed in the form of dB. The preset compression gain can also be applied to the compression processing of sound signals. The value of the specific compression gain can be selected according to the engineering experience value in the specific application scenario, for example, it is selected as 1 dB, and correspondingly, the frequency domain signal energy of the sound signal is increased by 1 dB after each decompression process.

The updating form of the total compression gain can be implemented according to the specific implementation, for example, during the current signal processing cycle, for a certain decompression frequency band, assuming the total compression gain is N before decompression, then after decompression of the target sound signal in the compression processing frequency band, the total compression gain is updated to N−1 or N+1, which corresponds to the update of the total compression gain after compression processing. For example, assuming the same compression gain is used in compression processing and decompression, which is 1 dB, then the total compression gain is updated to N+1 after compression, and correspondingly, after decompression, the total compression gain is updated to N−1.

After signal compression and release processing is carried out on the target sound signal, the total compression gain of the target sound signal in the compression and release frequency band can be updated correspondingly, and the compression and release processing of the target sound signal can be adjusted in real time according to the total compression gain of each compression and release frequency band and the transmission state of the corresponding sound signal in the subsequent signal processing cycle, adaptive adjustment of signal compression and release can realize dynamic compression processing of target sound signal, remove signal distortion more accurately, and at the same time effectively ensure the transmission performance of target sound signal.

EXAMPLE

Figure 4:
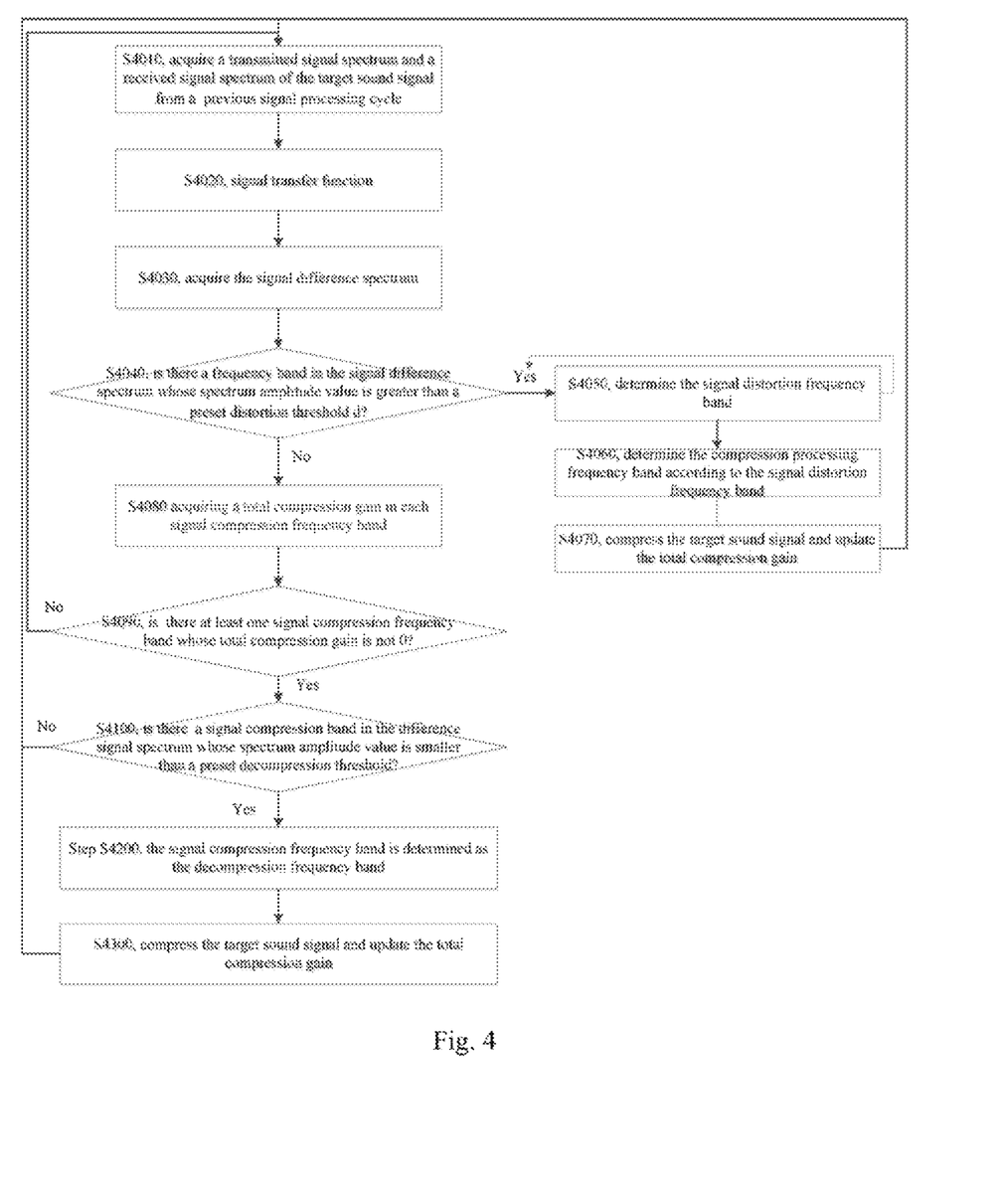
FIG. 4 is a schematic flowchart of a sound signal processing method according to one example of the present disclosure.

The sound signal processing method provided in this embodiment will be further explained with reference to FIG. 4.

This example is implemented in a device comprising a speaker and a microphone, assuming the compression upper limit coefficient is set to ½, the compression lower limit coefficient is set to ⅓, the preset compression gain is set to 1 dB, the distortion threshold is set to 0.4 dB, and the decompression threshold is set to 0.3 dB.

The sound signal processing method may comprise the following steps:

step S4010, acquiring, from a previous signal processing cycle, a transmitted signal spectrum P1 of a target sound signal sent out by the loudspeaker and a received signal spectrum P2 of the target sound signal received by the microphone.

Step S4020, acquiring a signal transfer function F of the sound signal transmitted to the microphone through the speaker.

Step S4030, acquiring a signal difference spectrum D according to the signal transfer function H, the transmitted signal spectrum P1 and the received signal spectrum P2.

Step S4040, judging whether there is a frequency band whose spectrum amplitude is larger than a preset distortion threshold in the signal difference spectrum, if so, executing step S4050, if not, executing step S4080.

Step S4050, determining a frequency band with a spectrum amplitude value larger than a preset distortion threshold as the signal distortion frequency band.

Step S4060, determining a compression processing frequency band [F1/3,F2/2] for performing compression processing on the target sound signal according to a preset compression upper limit coefficient and a preset compression lower limit coefficient and the signal distortion frequency band.

Step S4070, during the current signal processing cycle, compressing the signal of the target sound signal in the compression processing frequency band [F1/3,F2/2] by 1 dB, and correspondingly updating the total compression gain of the target sound signal in the compression processing frequency band. Then, returning to step S4010 and waiting for the next signal processing cycle to process the target sound signal.

For example, the total compression gain before compression processing is N, and after compression processing, the total compression gain is updated to N−1.

Step S4080, acquiring a total compression gain N of the target sound signal in each signal compression frequency band subjected to signal compression processing.

Step S4090, judging whether there is at least one signal compression band whose total compression gain is not 0, if so, executing step S4100; if not, returning to step S4010 to wait till the next signal processing cycle to process the target sound signal.

Step S4100, judging whether there is a signal compression hand in the signal difference spectrum D whose spectrum amplitude value is smaller than a preset decompression threshold, if so, executing step S4200, if not, returning to step S4010 to wait till the next signal processing cycle to process the target sound signal.

Step S4200, determining the signal compression frequency band as the decompression frequency band.

Step S4300, during the current signal processing cycle, in the decompression frequency band, performing 1 dB decompression processing on the target sound signal, and correspondingly updating the total compression gain of the target sound signal in the decompression frequency band, and then, returning to step S4010 to wait till the next signal processing cycle to process the target sound signal.

For example, assuming the total compression gain is N before decompression processing, then, after decompression processing, the total compression gain is updated to N+1.

In this example, for a device comprising a speaker and a microphone, it is possible to detect whether there is a signal distortion band in the target sound signal according to the transmitted signal spectrum of the target sound signal sent out by the speaker and the received signal spectrum of the target sound signal received by the microphone in the same device, and perform corresponding signal compression processing for the target sound signal in the signal distortion band; on the other hand, when there is no signal distortion band, it is possible to detect whether there is a decompression band in the target sound signal that needs decompression processing, and carry out corresponding decompression processing for the target sound signal in the decompression band, thereby realizing adaptive and dynamic signal compression processing based on the current signal transmission state, accurately eliminating signal distortion, effectively ensuring the transmission performance of sound signals, improving the sound quality of sound signals emitted by speakers, and reducing risk of damage to speakers.

Sound Signal Processing Apparatus

Figure 5:
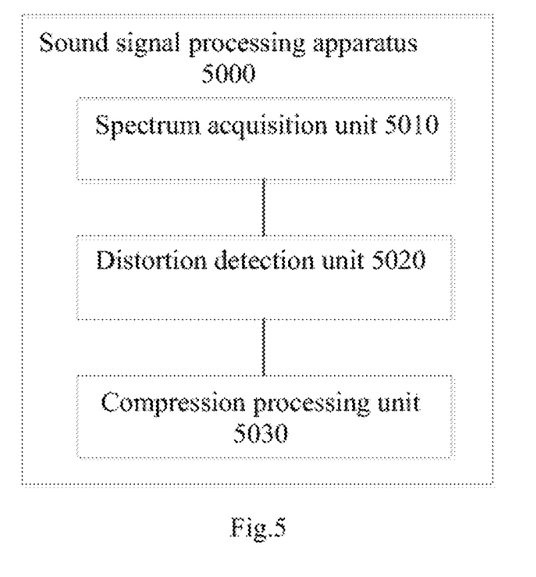
FIG. 5 is a schematic structural diagram of hardware of a sound signal processing apparatus according to an embodiment of the present disclosure.

In this embodiment, a sound signal processing apparatus 5000 is also provided, as shown in FIG. 5. The sound signal processing apparatus 5000 may comprise a spectrum acquisition unit 5010, distortion detection unit 5020 and a compression processing unit 5030, which are used to implement the sound signal processing method provided in this embodiment, and will not be described in detail here.

A spectrum acquisition unit 5010 may be configured to acquire, from a previous signal processing cycle, a transmitted signal spectrum of a target sound signal sent out by the loudspeaker and a received signal spectrum of the target sound signal received by the microphone.

a distortion detection unit 5020 may be configured to detect whether there is a signal distortion frequency band with signal distortion in the target sound signal, according to the transmitted signal spectrum and the received signal spectrum.

In a more specific example, the distortion detection unit 5020 may comprise a signal transfer function acquisition subunit 5021, a signal difference spectrum acquisition subunit 5022, and a signal distortion frequency band determination subunit 5023.

The signal transfer function acquisition subunit 5021 may be configured to acquire acquiring a signal transfer function of the sound signal transmitted to the microphone through the speaker.

The signal difference spectrum acquisition subunit 5022 may be configured to acquire a signal difference spectrum according to the signal transfer function, the transmitted signal spectrum and the received signal spectrum.

The signal distortion frequency band determining subunit 5023 may be configured to determine a frequency band with a spectrum amplitude value larger than a preset distortion threshold as the signal distortion frequency band, when detecting that the frequency band with the spectrum amplitude value larger than the preset distortion threshold exists in the signal difference spectrum.

A compression processing unit 5030 may be configured to perform compression processing on the target sound signal according to the signal distortion frequency band during the current signal processing cycle when detecting that the signal distortion frequency band exists, and transmitting a compressed target sound signal through the loudspeaker.

In a more specific example, the compression processing unit 5030 may comprise a compression processing frequency band determining subunit 5031 and a total compression gain updating subunit 5032.

The compression processing frequency band determining subunit 5031 may be configured to determine a compression processing frequency band for performing compression processing on the target sound signal according to a preset compression upper limit coefficient, a preset compression lower limit coefficient and the signal distortion frequency band.

The total compression gain updating subunit 5032 may be configured to perform compression processing on the target sound signal in the compression processing frequency band according to a preset compression gain during the current signal processing cycle, and correspondingly updating a total compression gain of the target sound signal in the compression processing frequency band.

In an embodiment, the sound signal processing apparatus may further comprise a decompression frequency band detection unit 5100 and an output unit 5200.

The decompression band detection unit 5100 may be configured to detect whether a decompression frequency band exists in the target sound signal when detecting that the signal distortion frequency band does not exist.

In a more specific example, the decompression frequency band detection unit 5100 may comprise a total compression gain acquisition subunit 5110a and a decompression frequency band determination subunit 5120a.

The total compression gain acquisition subunit 5110a may be configured to acquire, from the previous signal processing cycle, a total compression gain of the target sound signal in each signal compression frequency band subjected to signal compression processing.

The decompression frequency band determining subunit 5120a may be configured to determine the signal compression frequency band as the decompression frequency band when there is at least one signal compression frequency band with the total compression gain other than 0 and when it is detected that the spectrum amplitude values of the signal compression frequency band are all smaller than a preset decompression threshold in the signal difference spectrum acquired according to the signal transfer function, the transmitted signal spectrum and the received signal spectrum.

In another more specific example, the decompression frequency band detection unit 5100 may comprise a total compression gain acquisition subunit 5110b and a decompression frequency band determination subunit 5120b.

The total compression gain acquisition subunit 5110b may be configured to acquire a total compression gain of the target sound signal in each signal compression frequency band subjected to signal compression processing from the previous signal processing cycle.

The decompression frequency band determining subunit 5120b can be used to determine the signal compression frequency band as the decompression frequency band fir each signal compression frequency band whose total compression gain is not 0, when spectrum amplitude values of a compressed signal difference spectrum are detected to be smaller than the preset decompression threshold in the compressed signal difference spectrum acquired according to the signal transfer function, the transmitted signal spectrum and the received signal spectrum.

The output unit 5200 may be configured to perform decompression processing on the target sound signal according to a signal release frequency band during a current signal processing cycle when detecting that the decompression frequency band exists, and transmitting a decompressed target sound signal through the loudspeaker.

In a more specific example, the output unit 5200 may comprise a subunit that perform decompression processing on the target sound signal in the decompression frequency band according to the preset compression gain during the current signal processing cycle, and correspondingly updating a total compression gain of the target sound signal in the decompression frequency band.

It should be understood by those skilled in the art that the sound signal processing apparatus 5000 can be implemented in various ways. For example, the sound signal processing apparatus 5000 can be achieved by configuring a processor with instructions. For example, the sound signal processing apparatus 5000 can be achieved by storing instructions in a ROM and reading the instructions from the ROM into a programmable device when the device is started. For example, the sound signal processing apparatus 5000 may be solidified into a dedicated device (for example, an ASIC). The sound signal processing apparatus 5000 may be divided into independent units, or they may be implemented by combining them together. The sound signal processing apparatus 5000 can be achieved by one of the above-mentioned various implementations, or can be achieved by a combination of two or more of the above-mentioned various implementations.

Figure 6:
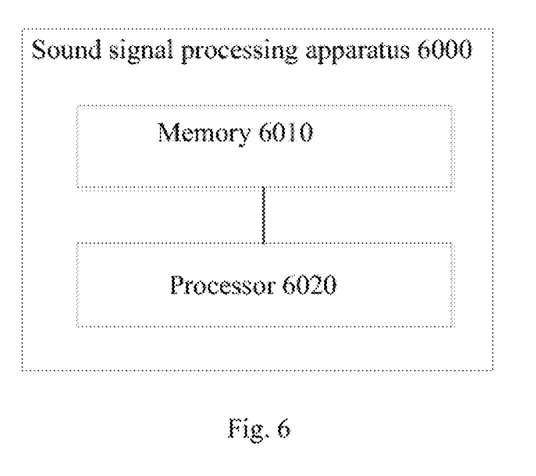
FIG. 6 is a block diagram of an example of a hardware configuration of a sound signal processing apparatus according to another embodiment of the present disclosure.

In this embodiment, another sound signal processing apparatus 6000 is also provided, as shown in FIG. 6, which comprises:

a memory 6010 configured to store executable instructions;

a processor 6020, configured to operate the sound signal processing device to execute the sound signal processing method provided in this embodiment under control of the executable instruction.

In this embodiment, the sound signal processing apparatus 6000 can be a module with sound signal processing function in other intelligent devices such as headphones, virtual reality devices, speakers, TV boxes, etc.

Sound Signal Processing Device

Figure 7:
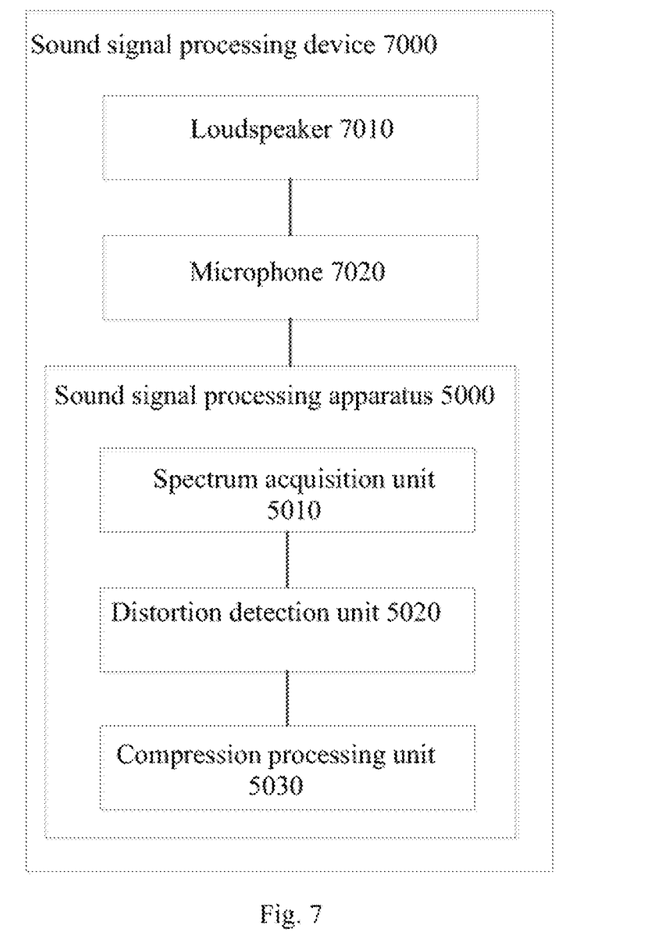
FIG. 7 is a schematic structural diagram of hardware of a sound signal processing device according to an embodiment of the present disclosure.
Figure 8:
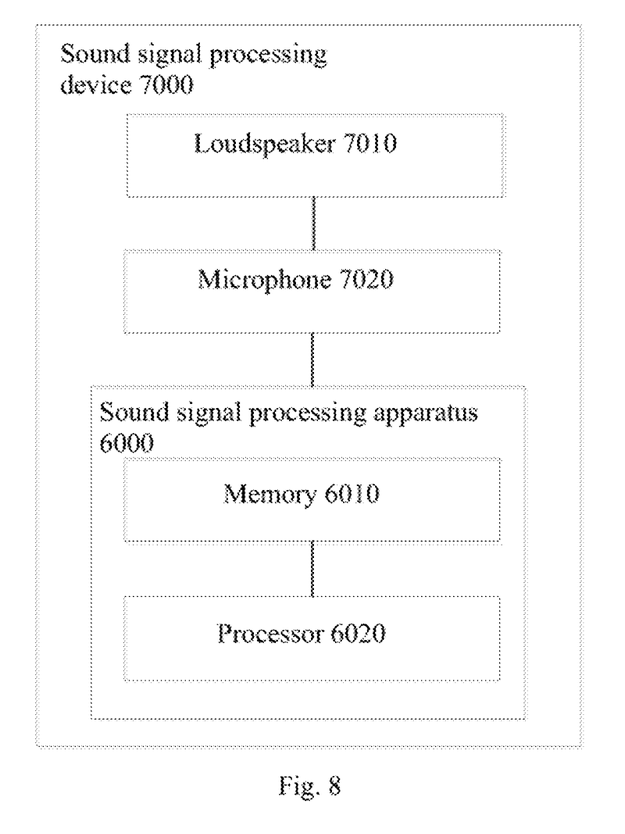
FIG. 8 is a schematic structural diagram of hardware of a sound signal processing apparatus according to another embodiment of the present disclosure.

In this embodiment, there is also provided a sound signal processing device 7000, the sound signal processing device 7000 comprises:

a speaker 7010 configured to send out the signal spectrum of the transmitted target sound signal;

a microphone 7020 configured to receive the signal spectrum of the received target sound signal;

the sound signal processing apparatus 5000 or the sound signal processing apparatus 6000 provided in this embodiment.

For example, as shown in FIG. 7, the sound signal processing apparatus 7000 comprises a sound signal processing apparatus 5000, or as shown in FIG. 8, the sound signal processing apparatus 7000 comprises a sound signal processing apparatus 6000.

In this embodiment, the sound signal processing device can be headphones, virtual reality device, sound boxes, TV boxes and other intelligent device. In this embodiment, the corresponding sound signal processing method can be implemented by the sound signal processing device, which is not repeated here.

The sound signal processing method, apparatus and device provided in this embodiment have been explained with reference to the drawings and examples, for device comprising speakers and microphones, it is possible to detect whether there is a signal distortion band with signal distortion in the target audio signal according to the transmitted signal spectrum of the target audio signal emitted by the speakers and the received signal spectrum of the target audio signal received by the microphone in the same equipment, according to the target sound signal in the signal distortion frequency band, the corresponding signal compression processing is carried out, so that the signal distortion is eliminated adaptively and dynamically, the sound quality of the sound signal emitted by the loudspeaker is improved, and the damage risk of the loudspeaker is reduced at the same time.

The present disclosure may be a system, a method, and/or a computer program product. The computer program product may include a computer readable storage medium (or media) having computer readable program instructions thereon for causing a processor to carry out aspects of the present disclosure.

The computer readable storage medium can be a tangible device that can retain and store instructions for use by an instruction execution device. The computer readable storage medium may be, for example, but is not limited to, an electronic storage device, a magnetic storage device, an optical storage device, an electromagnetic storage device, a semiconductor storage device, or any suitable combination of the foregoing. A non-exhaustive list of more specific examples of the computer readable storage medium includes the following: a portable computer diskette, a hard disk, a random access memory (RAM), a read-only memory (ROM), an erasable programmable read-only memory (EPROM or Flash memory), a static random access memory (SRAM), a portable compact disc read-only memory (CD-ROM), a digital versatile disk (DVD), a memory stick, a floppy disk, a mechanically encoded device such as punch-cards or raised structures in a groove having instructions recorded thereon, and any suitable combination of the foregoing. A computer readable storage medium, as used herein, is not to be construed as being transitory signals per se, such as radio waves or other freely propagating electromagnetic waves, electromagnetic waves propagating through a waveguide or other transmission media (e.g., light pulses passing through a fiber-optic cable), or electrical signals transmitted through a wire.

Computer readable program instructions described herein can be downloaded to respective computing/processing devices from a computer readable storage medium or to an external computer or external storage device via a network, for example, the Internet, a local area network, a wide area network and/or a wireless network. The network may comprise copper transmission cables, optical transmission fibers, wireless transmission, routers, firewalls, switches, gateway computers and/or edge servers. A network adapter card or network interface in each computing/processing device receives computer readable program instructions from the network and forwards the computer readable program instructions for storage in a computer readable storage medium within the respective computing/processing device.

Computer readable program instructions for carrying out operations of the present disclosure may be assembler instructions, instruction-set-architecture (ISA) instructions, machine instructions, machine dependent instructions, microcode, firmware instructions, state-setting data, or either source code or object code written in any combination of one or more programming languages, comprising an object oriented programming language such as Smalltalk, C++ or the like, and conventional procedural programming languages, such as the "C" programming language or similar programming languages. The computer readable program instructions may execute entirely on the user's computer, partly on the user's computer, as a stand-alone software package, partly on the user's computer and partly on a remote computer or entirely on the remote computer or server. In the latter scenario, the remote computer may be connected to the user's computer through any type of network, comprising a local area network (LAN) or a wide area network (WAN), or the connection may be made to an external computer (for example, through the Internet using an Internet Service Provider). In some embodiments, electronic circuitry comprising, for example, programmable logic circuitry, field-programmable gate arrays (FPGA), or programmable logic arrays (PLA) may execute the computer readable program instructions by utilizing state information of the computer readable program instructions to personalize the electronic circuitry, in order to perform aspects of the present disclosure.

Aspects of the present disclosure are described herein with reference to flowchart illustrations and/or block diagrams of methods, apparatus (systems), and computer program products according to embodiments of the invention. It will be understood that each block of the flowchart illustrations and/or block diagrams, and combinations of blocks in the flowchart illustrations and/or block diagrams, can be implemented by computer readable program instructions.

These computer readable program instructions may be provided to a processor of a general purpose computer, special purpose computer, or other programmable data processing apparatus to produce a machine, such that the instructions, which execute via the processor of the computer or other programmable data processing apparatus, create means for implementing the functions/acts specified in the flowchart and/or block diagram block or blocks. These computer readable program instructions may also be stored in a computer readable storage medium that can direct a computer, a programmable data processing apparatus, and/or other devices to function in a particular manner, such that the computer readable storage medium having instructions stored therein comprises an article of manufacture comprising instructions which implement aspects of the function/act specified in the flowchart and/or block diagram block or blocks.

The computer readable program instructions may also be loaded onto a computer, other programmable data processing apparatus, or other device to cause a series of operational steps to be performed on the computer, other programmable apparatus or other device to produce a computer implemented process, such that the instructions which execute on the computer, other programmable apparatus, or other device implement the functions/acts specified in the flowchart and/or block diagram block or blocks.

The flowchart and block diagrams in the Figures illustrate the architecture, functionality, and operation of possible implementations of systems, methods and computer program products according to various embodiments of the present disclosure. In this regard, each block in the flowchart or block diagrams may represent a module, segment, or portion of code, which comprises one or more executable instructions for implementing the specified logical function(s). It should also be noted that, in some alternative implementations, the functions noted in the block may occur out of the order noted in the figures. For example, two blocks shown in succession may, in fact, be executed substantially concurrently, or the blocks may sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts, or combinations of special purpose hardware and computer instructions. It is well-known to a person skilled in the art that the implementations of using hardware, using software or using the combination of software and hardware can be equivalent.

Embodiments of the present disclosure have been presented for purposes of illustration, but are not intended to be exhaustive or limited to the embodiments disclosed. Numerous modifications and changes will be apparent to those skilled in the art without departing from the scope and spirit of the illustrated embodiments. The terminology used herein was chosen to best explain the principles of the embodiments, the practical application or technical improvement over technologies found in the marketplace, or to enable others of ordinary skill in the art to understand the embodiments disclosed herein. The scope of the present disclosure is defined by the appended claims.

The invention claimed is:

1. A method for processing a sound signal, wherein the method is implemented in a device comprising a loudspeaker and a microphone, and the method comprises
    acquiring, from a previous signal processing cycle, a transmitted signal spectrum of a target sound signal sent out by the loudspeaker and a received signal spectrum of the target sound signal received by the microphone;
    detecting a presence or an absence of a signal distortion frequency band with signal distortion in the target sound signal according to the transmitted signal spectrum and the received signal spectrum, and
    upon detecting the presence of the signal distortion frequency band,
    performing compression processing on the target sound signal according to the signal distortion frequency band during a current signal processing cycle to generate a compressed target sound signal,
    and transmitting the compressed target sound signal through the loudspeaker,
    upon detecting the absence of the signal distortion frequency band detecting whether a decompression frequency band exists in the target sound signal;
    upon detecting the presence of the decompression frequency band, performing decompression processing on the target sound signal according to a signal release frequency band in a current signal processing cycle to generate a decompressed target sound signal, and transmitting the decompressed target sound signal through the loudspeaker;
    wherein the detecting whether a decompression frequency band exists in the target sound signal comprises:
    acquiring the total compression gain of the target sound signal in each signal compression frequency band subjected to signal compression processing from the previous signal processing cycle;
    when there is at least one signal compression frequency band with the total compression gain other than 0 and when it is detected that spectrum amplitude values of the signal
    compression frequency band are all smaller than a preset decompression threshold in the signal difference spectrum acquired according to the signal transfer function, the transmitted signal spectrum and the received signal spectrum,
    determining the signal compression frequency band as the decompression frequency band;
    wherein the signal transfer function is a transfer function of sound signal transmitted to the microphone through the speaker,
    wherein detecting whether a decompression frequency band exists in the target sound signal comprises:
    acquiring a total compression gain of the target sound signal in each signal compression frequency band subjected to signal compression processing from the previous signal processing cycle;
    for each signal compression frequency band whose total compression gain is not 0, determining the signal compression frequency band as the decompression frequency band when spectrum amplitude values of the compressed signal difference spectrum are detected to be smaller than the preset decompression threshold in the compressed signal difference spectrum acquired according to the signal transfer function, the transmitted signal spectrum and the received signal spectrum;
    wherein the signal transfer function is a transfer function of sound signal transmitted to the microphone through the speaker.

2. The method according to claim 1, wherein the detecting the presence or the absence of a signal distortion band with signal distortion comprises:
    acquiring a signal transfer function of the sound signal transmitted to the microphone through the speaker;
    acquiring a signal difference spectrum according to the signal transfer function, the transmitted signal spectrum and the received signal spectrum;
    determining a frequency band with a spectrum amplitude value larger than a preset distortion threshold as the signal distortion frequency band when detecting that the frequency band with the spectrum amplitude value larger than the preset distortion threshold exists in the signal difference spectrum.

3. The method according to claim 1, wherein compression processing comprises:
    determining a compression processing frequency band for performing compression processing on the target sound signal according to a preset compression upper limit coefficient, a preset compression lower limit coefficient and the signal distortion frequency band;
    during the current signal processing cycle, performing compression processing on the target sound signal in the compression processing frequency band according to a preset compression gain, and correspondingly updating a total compression gain of the target sound signal in the compression processing frequency band.

4. The method according to claim 1, wherein the decompression processing comprises:
    during the current signal processing cycle, performing decompression processing on the target sound signal in the decompression frequency band according to the preset compression gain, and correspondingly updating a total compression gain of the target sound signal in the decompression frequency band.

5. A sound signal processing apparatus, comprising:
    a memory configured to store executable instructions;
    a processor configured to operate the sound signal processing apparatus under control of the executable instructions to perform the sound signal processing method comprising a loudspeaker and a microphone, and
    acquiring, from a previous signal processing cycle, a transmitted signal spectrum of a target sound signal sent out by the loudspeaker and a received signal spectrum of the target sound signal received by the microphone;
    detecting a presence or an absence of a signal distortion frequency band with signal distortion in the target sound signal according to the transmitted signal spectrum and the received signal spectrum, and
    upon detecting the presence of the signal distortion frequency band,
    performing compression processing on the target sound signal according to the signal distortion frequency band during a current signal processing cycle to generate a compressed target sound signal, and transmitting the compressed target sound signal through the loudspeaker, upon detecting the absence of the signal distortion frequency band detecting whether a decompression frequency band exists in the target sound signal;

upon detecting the presence of the decompression frequency band, performing decompression processing on the target sound signal according to a signal release frequency band in a current signal processing cycle to generate a decompressed target sound signal, and transmitting the decompressed target sound signal through the loudspeaker;

wherein the detecting whether a decompression frequency band exists in the target sound signal comprises:

acquiring the total compression gain of the target sound signal in each signal compression frequency band subjected to signal compression processing from the previous signal processing cycle;

when there is at least one signal compression frequency band with the total compression gain other than 0 and when it is detected that spectrum amplitude values of the signal compression frequency band are all smaller than a preset decompression threshold in the signal difference spectrum acquired according to the signal transfer function, the transmitted signal spectrum and the received signal spectrum, determining the signal compression frequency band as the decompression frequency band;

wherein the signal transfer function is a transfer function of sound signal transmitted to the microphone through the speaker, wherein detecting whether a decompression frequency band exists in the target sound signal comprises:

acquiring a total compression gain of the target sound signal in each signal compression frequency band subjected to signal compression processing from the previous signal processing cycle;

for each signal compression frequency band whose total compression gain is not 0, determining the signal compression frequency band as the decompression frequency band when spectrum amplitude values of the compressed signal difference spectrum are detected to be smaller than the preset decompression threshold in the compressed signal difference spectrum acquired according to the signal transfer function, the transmitted signal spectrum and the received signal spectrum;

wherein the signal transfer function is a transfer function of sound signal transmitted to the microphone through the speaker.

6. A sound signal processing device, comprising: a loudspeaker;

a microphone; the sound signal processing apparatus of comprising:

a memory configured to store executable instructions;

a processor configured to operate the sound signal processing apparatus under control of the executable instructions to perform the sound signal processing method comprising a loudspeaker and a microphone, and acquiring, from a previous signal processing cycle, a transmitted signal spectrum of a target sound signal sent out by the loudspeaker and a received signal spectrum of the target sound signal received by the microphone;

detecting a presence or an absence of a signal distortion frequency band with signal distortion in the target sound signal according to the transmitted signal spectrum and the received signal spectrum, and upon detecting the presence of the signal distortion frequency band, performing compression processing on the target sound signal according to the signal distortion frequency band during a current signal processing cycle to generate a compressed target sound signal, and transmitting the compressed target sound signal through the loudspeaker, upon detecting the absence of the signal distortion frequency band detecting whether a decompression frequency band exists in the target sound signal;

upon detecting the presence of the decompression frequency band, performing decompression processing on the target sound signal according to a signal release frequency band in a current signal processing cycle to generate a decompressed target sound signal, and transmitting the decompressed target sound signal through the loudspeaker;

wherein the detecting whether a decompression frequency band exists in the target sound signal comprises:

acquiring the total compression gain of the target sound signal in each signal compression frequency band subjected to signal compression processing from the previous signal processing cycle;

when there is at least one signal compression frequency band with the total compression gain other than 0 and when it is detected that spectrum amplitude values of the signal compression frequency band are all smaller than a preset decompression threshold in the signal difference spectrum acquired according to the signal transfer function, the transmitted signal spectrum and the received signal spectrum, determining the signal compression frequency band as the decompression frequency band;

wherein the signal transfer function is a transfer function of sound signal transmitted to the microphone through the speaker, wherein detecting whether a decompression frequency band exists in the target sound signal comprises:

acquiring a total compression gain of the target sound signal in each signal compression frequency band subjected to signal compression processing from the previous signal processing cycle;

for each signal compression frequency band whose total compression gain is not 0, determining the signal compression frequency band as the decompression frequency band when spectrum amplitude values of the compressed signal difference spectrum are detected to be smaller than the preset decompression threshold in the compressed signal difference spectrum acquired according to the signal transfer function, the transmitted signal spectrum and the received signal spectrum;

wherein the signal transfer function is a transfer function of sound signal transmitted to the microphone through the speaker.

* * * * *